United States Patent [19]

Gonda

[11] 4,162,460

[45] Jul. 24, 1979

[54] OPTICAL CIRCUIT ELEMENT

[75] Inventor: Shunichi Gonda, Higashi-Murayama, Japan

[73] Assignee: Agency of Industrial Science & Technology, Tokyo, Japan

[21] Appl. No.: 781,886

[22] Filed: Mar. 28, 1977

[30] Foreign Application Priority Data

May 26, 1976 [JP] Japan .................................. 51-60158
Jun. 21, 1976 [JP] Japan .................................. 51-72227

[51] Int. Cl.$^2$ ............................................ H01S 3/19
[52] U.S. Cl. ................................ 331/94.5 H; 330/4.3; 331/94.5 P; 350/96.11
[58] Field of Search ................ 331/94.5 H, 94.5 E, 331/94.5 F, 94.5 P; 350/96 WG, 96 C, 356, 96.10, 96.11, 96.12, 96.13, 96.14, 96.34; 330/4.3

[56] References Cited

U.S. PATENT DOCUMENTS

| | | | |
|---|---|---|---|
| 3,761,837 | 9/1973 | Leheny et al. | 331/94.5 H |
| 3,949,315 | 4/1976 | Zeidler | 331/94.5 E |
| 4,057,321 | 11/1977 | Mahlein et al. | 350/356 X |

OTHER PUBLICATIONS

Gonda et al., "Laser Emission in Nitrogen-Implanted GaAs$_{1-x}$P$_x$(x=0.36 and 0.43)", *Japan, J. Appl. Phys.*, , vol. 15 (1976), pp. 567-568.
Gonda et al., "Promotion of Radiative Recombination in GaAs$_{1-x}$P$_x$ by N-Ion Implantation", *IEEE Trans. Electron Devices*, vol. ED22, No. 9, Sep. 1975, pp. 712-716.
Holonyak, Jr. et al., "Photoexcited Resonance-Enhanced Nitrogen-Trap GaAs$_{1-x}$P$_x$: N Laser", IEEE, J. of Quantum Electronics, vol. QE-9, No. 2, Feb. 1973, pp. 379-383.
Won-Tien Tsang et al., "GaAs-Ga$_{1-x}$Al$_x$As Double-Heterostructure Injection Lasers with Distributed Bragg Refectors", *Applied Physics Letters*, vol. 28, No. 10, May 15, 1976, pp. 596-598.

*Primary Examiner*—James W. Davie
*Attorney, Agent, or Firm*—Kurt Kelman

[57] ABSTRACT

An energy level due to isoelectronic impurity is provided in the forbidden band of one portion of an optical waveguide in a semiconductor material by doping said portion with an isoelectronic impurity. Upon excitation, a population inversion of electrons and holes is produced in the energy level and the valence band of said portion. When a light having a wavelength corresponding to the energy difference between the level of the isoelectronic impurity and the valence band is impinged on the portion, the incident light is amplified thereby. Since the optical energy of the output is smaller than the forbidden band gap, the attenuation in the waveguide is very small. By arranging Bragg type reflectors on both side portions of the region doped with the isoelectronic impurity, a semiconductor laser having superior selection characteristics of oscillation frequency is provided and the laser beam output thereby is only slightly attenuated in the waveguide due to the fact that the output laser beam is smaller than the forbidden band.

6 Claims, 10 Drawing Figures

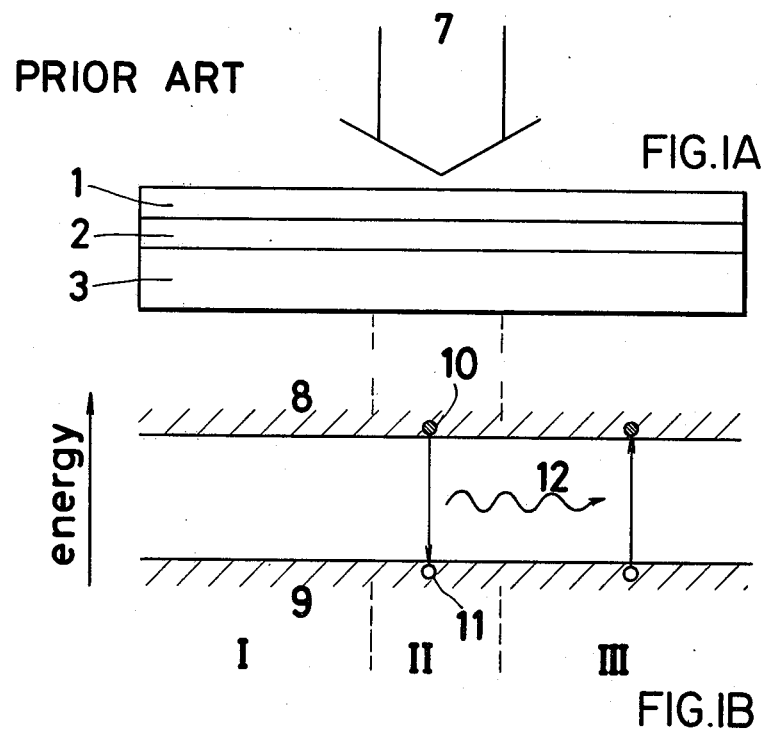
FIG.1A PRIOR ART
FIG.1B
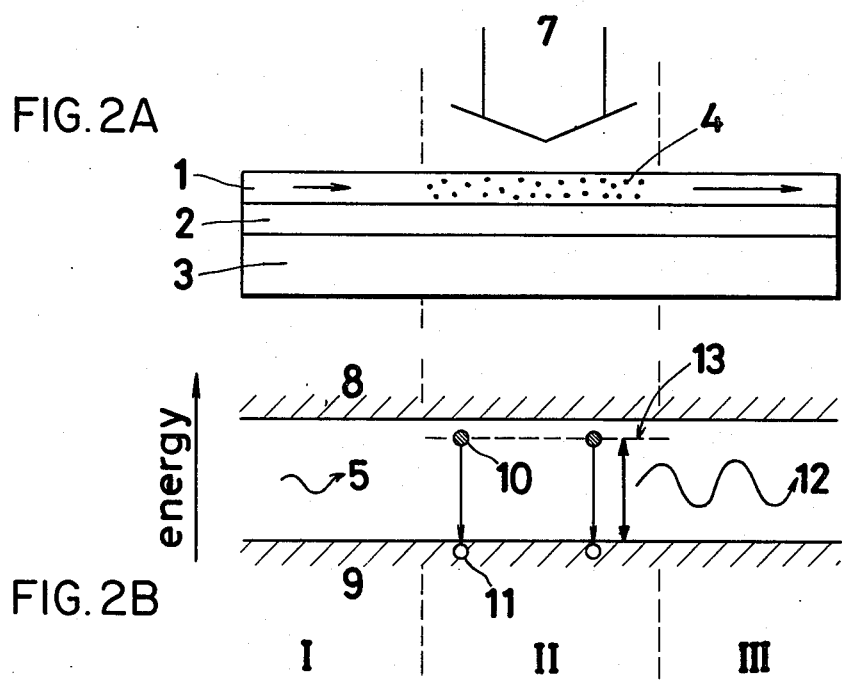
FIG.2A
FIG.2B

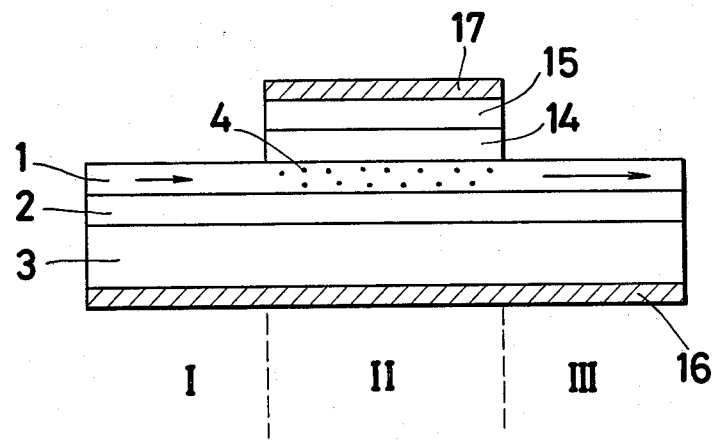
FIG. 3
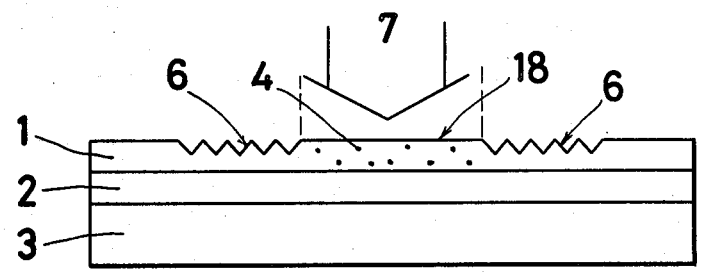
FIG. 4A
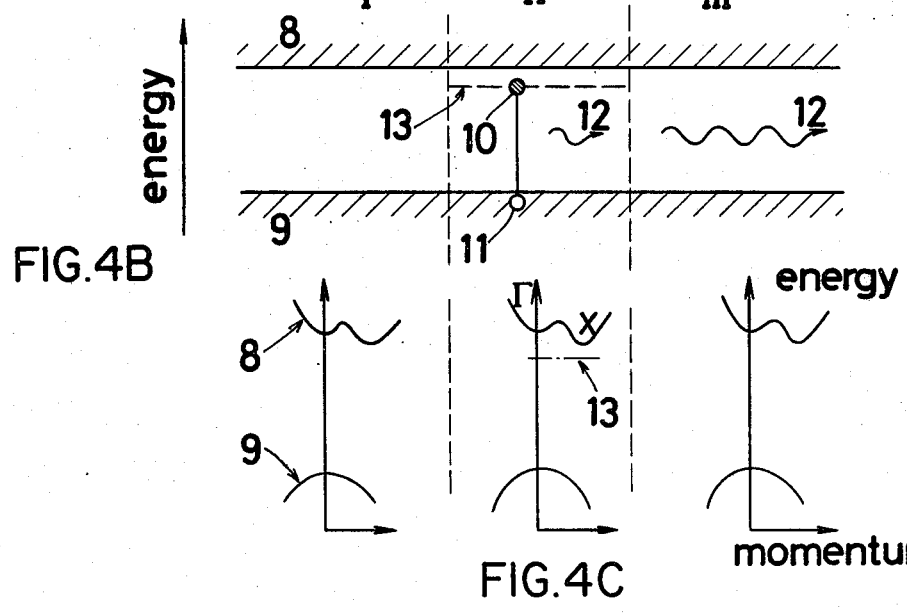
FIG. 4B
FIG. 4C

OPTICAL CIRCUIT ELEMENT

BACKGROUND OF THE INVENTION

The present invention relates to an optical integrated circuit element. More particularly, the present invention relates to an optical integrated circuit element having an optical waveguide which includes integrally as a portion thereof a region containing an isoelectronic impurity, in which region an optical amplification and/or laser function are performed.

It is well known that there sometimes arises the necessity of using a portion of an optical waveguide as an optical amplifier or laser as, for example, in the case of a repeater in an optical communication system. In general, optical amplification is realized by first causing an inversion in the electron and hole population of a material and then introducing the material with an incident light having energy nearly equal to the forbidden band gap of the material to stimulate recombination of electrons and holes and generate light having the same wavelength and phase as the incident light. However, when this principle is applied to an optical element, the amplification region is formed in a portion of the waveguide and as a result, the amplification effect is greatly reduced due to the large absorption loss in the waveguide when the waveguide region and the amplification region are made of the same material. Further, in order to use a portion of the waveguide as a laser, it has been proposed to use a distributed Bragg reflector type semiconductor laser which has a reflector on opposite sides of the amplification region of the waveguide formed by providing periodical corrugation, the pitch of which is a half integer times the oscillation wavelength. This is because, when a laser is required to be contained as a portion of a monolithic optical integrated circuit, it is impossible to use the cleavage plane which has been used as the reflector. Also in this case, when the Bragg reflection region is made of the same material as that of the waveguide, the re-absorption of the light output generated in the Bragg reflection region is large in the optical waveguide and, therefore, the efficiency thereof as a whole becomes low. In order to avoid this disadvantage, it is usual to made the Bragg reflection region with a material which exhibits lesser absorption or to taper the waveguide to guide the light to a layer of low absorption. The above methods of avoiding the above mentioned disadvantage require a complicated waveguide structure, causing an increase in fabricating processes and hence an increase in cost.

An object of the present invention is to provide an optical circuit element which is easily formed integrally with an optical waveguide and which works as an amplifier and a laser and couples with waveguide region with high efficiency.

SUMMARY OF THE INVENTION

In order to achieve the above objects, according to the present invention, isoelectronic impurities are introduced into a portion of an optical waveguide of a semiconductor material by using ion-implantation, diffusion or a selective doping crystal growth method etc. to generate an impurity level in the forbidden band thereof and optical amplification or optical emission is accomplished by stimulated recombination of electrons in the impurity level and holes in the valence band. The energy difference between the impurity levels in the forbidden band and the valence band is smaller than the energy gap in the forbidden band. Therefore, a light produced by the stimulated emission of electrons and holes in the impurity level and the valence band is absorbed less in the undoped region, i.e., the region of the optical waveguide and thus the attenuation thereof is very small.

Other objects and features of the present invention will be clear from the following description with reference to the accompanying drawings.

BRIEF DESCRIPTION OF THE DRAWING

FIG. 1(A) is an explanatory illustration of an optical amplifier in a conventional optical waveguide, FIG. 1(B) is an explanatory illustration showing a state of energy distribution in the optical amplifier of FIG. 1(A), FIG. 2(A) is an explanatory illustration of a circuit element of the present invention when applied to an optical amplifier element, FIG. 2(B) is an explanatory illustration of the energy state of the circuit element in FIG. 2(A), FIG. 3 is an explanatory illustration of another embodiment of the present circuit element when applied as an optical amplifier element, FIG. 4)A) is an explanatory illustration of the present element when applied as a laser, FIG. 4(B) is an explanatory illustration of the energy state of the element in FIG. 4(A), FIG. 4(C) is an explanatory illustration of the relation between the energy and momentum of the element in FIG. 4(A)

DESCRIPTION OF THE PREFERRED EMBODIMENTS

Figure 5:
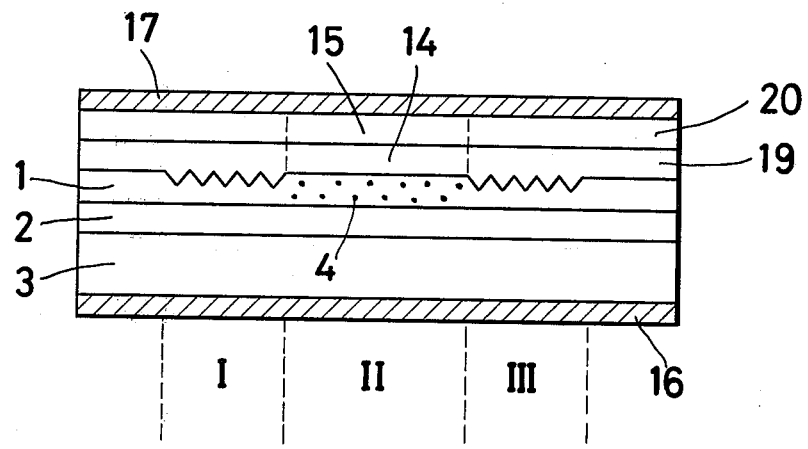
FIG. 5 is an explanatory illustration of another embodiment of the present element when applied as a laser.

Referring first to FIGS. 1(A) and 1(B), optical amplification has heretofore been accomplished by stimulating the recombination of electrons 10 in the conduction band 8 and holes 11 in the valence band 9 in an optical waveguide 1 provided on a substrate 3 via a layer 2 with a lower refractive index. In this case, however, even if an amplification region II is formed by optically exciting a portion of the waveguide 1 by irradiation of a light 7, the amplified light is attenuated by the re-absorption of electrons and holes when the amplified light passes through the region II to a waveguide region III as shown in FIG. 1(B).

An embodiment of the present invention will firstly be described with reference to FIGS. 2(A) and 2(B) in which the present optical circuit element is used as an amplifier.

Referring to FIG. 2(A), a region II of the optical waveguide 1 which is intended to be used as an optical amplifier is doped with isoelectronic impurity 4. The isoelectronic impurity 4 produces an energy level 13 in a forbidden band which is below the conduction band as shown in FIG. 2(B) when the optical waveguide is constituted with an indirect transition type semiconductor or a direct transition type semiconductor whose composition ratio is near the direct-indirect transition point. When an excitation light 7 is directed thereto to produce a population inversion of the electrons 10 and the holes 1 in the energy level 13 and the valence band 9, respectively, and an input light 5 having a wavelength in the range shown by the double-headed arrow and corresponding to the energy gap between the isoelectronic impurity level 13 and the valence band 9 is impinged thereon, a stimulated emission occurs in the region II and an output light 12 having the same wavelength and phase as the input light 5 is emitted. Since the energies of lights 5 and 12 are smaller than the width of the forbidden band, the attenuation loss in the regions I and III of the optical waveguide is small and thus the attenuation is very small.

Instead of the excitation light, it is possible to perform the optical amplification by current excitation as shown in FIG. 3. In this case, the substrate 3 and the low refraction layer 2 are made of n-type semiconductor, the waveguide regions I and III of the layer 1 contain no impurity to reduce the absorption loss due to the carrier and only the region II is doped with the isoelectronic impurity. On the layer 1 a p-type semiconductor layer 14 whose refractive index is lower than that of the layer 1 is grown. On the layer 14, a buffer layer 15 is formed to facilitate attachment of an ohmic electrode 17 thereon. In this structure, when a current is passed by connecting the positive and negative terminals of a battery to the electrode 17 and an electrode 16, respectively, holes and electrons are injected from the layer 14 and the layer 2, respectively, into the amplifier portion of the layer 1, causing a population inversion by which an optical amplification is performed. In principle, the same effect may be obtained by reversing the n- and p-layers and terminals of a battery.

FIGS. 4(A), 4(B) and 4(C) show another embodiment in which a semiconductor laser is formed in the optical waveguide.

Basically, the embodiment is composed of a light emitting portion 18 and distributed feedback portions 6 provided at the opposite ends of the light emitting portion 18. The light emitting portion 18 has the same structure as that of the previously mentioned amplification portion (region II) of the amplifier, that is, the optical waveguide 1 has the region II doped with the isoelectronic impurity 4 to form the energy level 13 of the isoelectronic impurity as shown in FIG. 4(B).

Since the energy level 13 is formed below the valley at a point X of the conduction band 8 as shown in FIG. 4(C), the energy level 13 of the isoelectronic impurity is formed in the forbidden band as shown in FIGS. 4(B) and 4(C) when the semiconductor material is a crystal mixture having a composition ratio of the indirect transition type or of a direct transition type whose composition ratio is near the direct-indirect transition point. Therefore, a light 12 produced due to recombination of electrons 10 in the level 13 and holes 11 in the valence band has a wavelength corresponding to an energy smaller than the forbidden band width.

The distributed feedback portion 6 is a Bragg reflector composed of a periodically formed corrugation. The pitch of the corrugation is a half integer times the wavelength of light to be produced by the light emitting portion.

The self absorption of the light 12 produced by irradiating the light emitting portion 18 with the excitation light 7 in the Bragg reflectors 6 is very small because the wavelength thereof corresponds to energy smaller than the forbidden band width. Light emitted to the waveguide due to a laser oscillation is also less attenuated by absorption for the same reason as above.

When the waveguide layer 1 is made of an indirect transition type semiconductor, the relation between energy and momentum therein becomes as shown in FIG. 4(C). In this case, when a light near the forbidden band width travels through the semiconductor, the absorption thereof is very small. Therefore, with the indirect transition type semiconductor, it is possible not only to increase the radiation transition by introducing the isoelectronic impurity 4 into the light emitting portion (active portion) 18 but also to decrease the loss due to the absorption in the distributed Bragg reflectors 6, thus facilitating the laser oscillation. Since it is also possible to reduce the loss due to the absorption of light emitted to the waveguide portion 5, it is unnecessary to use a tapered waveguide or to grow a crystal of material having a broad forbidden band width on only the waveguide portion for coupling the laser and the waveguide. Therefore, by using the indirect transition type semiconductor an effective coupling can be realized.

An embodiment of the method of fabricating the optical integrated circuit element according to the present invention will be described.

As the substrate, GaAs is used and on the substrate 3 the low refraction layer 2 of $Al_xGa_{1-x}As$ is grown to a thickness of about $3\mu$. On the low refraction layer 2, the waveguide layer 1 of $Al_yGa_{1-y}As$ is grown to a thickness of the order of $1\mu$, where $y < x$ and y is about 0.43 or more. The region II of the waveguide which is to be used as the amplification portion or the light emitting portion is doped with the isoelectronic impurity 4 of nitrogen atoms at a density of $10^{18} \sim 10^{19}$ atoms/cm$^3$.

The doping may be performed in various ways. One example of the doping is to use ion implantation in conjunction with a mask permitting nitrogen atoms to be introduced into only the light emitting portion 18. In order to make the distribution of nitrogen atoms in the waveguide layer 1 uniform, an initial acceleration energy of several 100 KeV is stepped down gradually. The doped material is annealed at 800°-900° C. in hydrogen gas or an innert gas environment.

When the electrode 17 is to be formed on the region II as shown in FIG. 3, the layer 14 is formed of $Al_xGa_{1-x}As$ doped with a layer amount of p-type impurity and on the layer 14 the layer 15 of p-type GaAs crystal is grown. Then, on the layer 15, the electrode 17 is vapor deposited.

The Bragg reflector may be formed on the opposite sides of the region II by providing the corrugations. The corrugations may be formed by providing photoresist in the usual manner, projecting thereon a holographic interference pattern, developing the pattern image and then photo-etching the pattern.

FIG. 5 shows a practical embodiment of the distributed Bragg reflection type semiconductor laser of the current excitation type. As the substrate 3, an n-type GaAs having low electric resistance is used. On the substrate 3, the layer 2 of an n-type $Al_xGa_{1-x}As$ having low electric resistance is grown. The waveguide layer 1 of $Al_yGa_{1-y}As$ ($y<x$) is grown on the layer 2 without doping. The region II of the waveguide layer 1 is ion-implanted with nitrogen atoms and the regions I and III of the layer 1 are formed with the corrugations for the Bragg reflectors. On the layer 1, a layer 19 of p-type $Al_xGa_{1-x}As$ having low electric resistance is formed and further a layer 20 of p-type GaAs is formed on the layer 19. In the regions I and III of the layers 19 and 20, protons are implanted to make the regions insulative and on the opposite surfaces of the structure, the electrodes 17 and 16 are attached. As another method, only the portions 14 and 15 in FIG. 5 may be made p-type, low resistance layers by using a conventional method such as selective diffusion of impurity. With this structure, the current can flow in only the light emitting portion and laser oscillation is facilitated.

Since the optical integrated circuit element according to the present invention is easily formed integrally with the optical waveguide, it is convenient to use in fabricating a monolithic optical integrated circuit.

Figure 6:
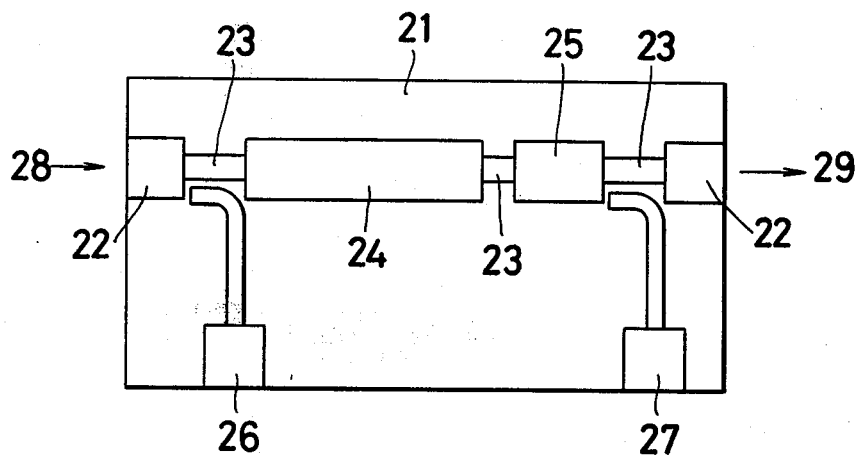
FIG. 6 is an explanatory illustration of an optical repeater constituted by the circuit element according to the present invention.

FIG. 6 shows an application of the present invention to an optical repeater. An input light 28 supplied through a fiber passes through a matching function portion 22 and a waveguide portion 23 and is amplified by an optical amplifier portion 24. The amplified light passes through a wave shaping portion 25 and another matching function portion 22 and is derived as an output light 29. Portions 26 and 27 are an input monitor and an output monitor, respectively. In case where this optical circuit is to be formed on a monolithic substrate 21, the optical circuit element according to the present invention is very useful.

It should be noted that the present invention can be utilized generally to couple the waveguide portion and the stimulated emission regions.

What is claimed is:

1. An optical circuit element comprising
   (a) a waveguide of a semiconductor material,
      (1) the composition of said semiconductor material being near the direct-indirect transition point and
      (2) said waveguide having integrally formed therein a region wherein stimulated emission occurs, said region being formed by doping a portion of said waveguide with an isoelectronic impurity, the energy level of said isoelectronic impurity being established within the forbidden band of said doped region,
   (b) means for producing a population inversion of electrons in the energy level of said doped region and holes in the valance band of said doped region,
   (c) means for recombining the electrons in said impurity level and holes in said valance band, and
   (d) means for introducing an input light having a wave-length corresponding to the energy difference between said level of said isoelectronic impurity and said valance band into said doped region whereby electrons in said impurity level and holes in said valance band are recombined to amplify said input light.

2. The optical circuit element of claim 1, wherein said semiconductor material composition is $Al_xGa_{1-x}As$.

3. The optical circuit element of claim 1, wherein said isoelectronic impurity consists of nitrogen atoms and the doping consisting of nitrogen atoms at a density of $10^{18}$–$10^{19}$ atoms/cm$^3$.

4. An optical circuit element comprising
   (a) a waveguide of a semiconductor material,
      (1) the composition of said semiconductor material being near the direct-indirect transition point and
      (2) said waveguide having integrally formed therein a region wherein stimulated emission occurs, said region being formed by doping a portion of said waveguide with an isoelectronic impurity, the energy level of said isoelectronic impurity being established within the forbidden band of said doped region,
   (b) means for producing a population inversion of electrons in the energy level of said doped region and holes in the valance band of said doped region,
   (c) means for recombining the electrons in said impurity level and holes in said valance band, and
   (d) periodical corrugation portions provided in a surface of said waveguide on opposite sides of said doped region along the direction of light propagation in said waveguide.

5. The optical circuit element of claim 4, wherein said semiconductor material composition is $Al_xGa_{1-x}As$.

6. The optical circuit element of claim 4, wherein said isoelectronic impurity consists of nitrogen atoms and the doping consisting of nitrogen atoms at a density of $10^{18}$–$10^{19}$ atoms/cm$^3$.

* * * * *